(12) United States Patent
Xiao et al.

(10) Patent No.: US 12,259,451 B2
(45) Date of Patent: Mar. 25, 2025

(54) NUCLEAR MAGNETIC RESONANCE COIL ARRAY AND DECOUPLING METHOD THEREOF, AND NUCLEAR MAGNETIC RESONANCE DETECTION DEVICE

(71) Applicant: CHINA UNIVERSITY OF PETROLEUM-BEIJING, Beijing (CN)

(72) Inventors: Lizhi Xiao, Beijing (CN); Sihui Luo, Beijing (CN); Guangzhi Liao, Beijing (CN); Zhengduo Wang, Beijing (CN); Yongheng Fan, Beijing (CN)

(73) Assignee: China University of Petroleum-Beijing, Beijing (CN)

( * ) Notice: Subject to any disclaimer, the term of this patent is extended or adjusted under 35 U.S.C. 154(b) by 458 days.

(21) Appl. No.: 17/681,289

(22) Filed: Feb. 25, 2022

(65) Prior Publication Data
US 2022/0179018 A1 Jun. 9, 2022

Related U.S. Application Data

(63) Continuation of application No. PCT/CN2019/110305, filed on Oct. 10, 2019.

(30) Foreign Application Priority Data

Aug. 30, 2019 (CN) .......................... 201910817886.1

(51) Int. Cl.
*G01R 33/36* (2006.01)
*G01R 33/34* (2006.01)
*G01V 3/32* (2006.01)

(52) U.S. Cl.
CPC ..... *G01R 33/365* (2013.01); *G01R 33/34069* (2013.01); *G01R 33/3628* (2013.01); *G01V 3/32* (2013.01)

(58) Field of Classification Search
CPC ............ G01R 33/34069; G01R 33/365; G01R 33/3628; G01V 3/32
(Continued)

(56) References Cited

U.S. PATENT DOCUMENTS

| 5,677,629 A * | 10/1997 | Borsboom ....... G01R 33/34046 |
| | | 324/318 |
| 7,248,051 B2 * | 7/2007 | Wang ................. G01R 33/3415 |
| | | 324/322 |

(Continued)

FOREIGN PATENT DOCUMENTS

| CN | 1183143 A | 5/1998 |
| CN | 1310345 A | 8/2001 |

(Continued)

OTHER PUBLICATIONS

Xin, Xuegang, Han, Jijun, Feng, Yanqiu, Chen, Wufan, Decoupling of Multi-channel RF Coil and its Application in the Intraoperative MRI, Journal of Biomedical Engineering, vol. 28, No. 2, Apr. 30, 2011, pp. 223-227, China Academic Journal Electronic Publishing House.

*Primary Examiner* — Paresh Patel
*Assistant Examiner* — Rahul Maini
(74) *Attorney, Agent, or Firm* — Pokalsky Wilczynski Brozek, LLP

(57) ABSTRACT

A nuclear magnetic resonance coil array and a decoupling method thereof, and a nuclear magnetic resonance detection device. The coil array includes: a coil resonant unit and a decoupling network unit, where the coil resonant unit includes multiple coil resonant circuits; the decoupling network unit includes multiple decoupling circuits; where a coil resonant circuit includes a coil and a resonant capacitor; the resonant capacitor in each coil resonant circuit is connected in parallel with the coil; the coils in each coil resonance circuit are equally spaced on a circumference; a (Continued)

decoupling circuit is provided between a positive terminal and a negative terminal of adjacent coils, respectively; each coil is connected to an antenna switching circuit of a nuclear magnetic resonance detection device at the same time.

17 Claims, 5 Drawing Sheets

(58) Field of Classification Search
USPC .................................................. 324/301–315
See application file for complete search history.

(56) References Cited

U.S. PATENT DOCUMENTS

| | | | | |
|---|---|---|---|---|
| 7,642,782 B2* | 1/2010 | Vernickel | ............ | G01R 33/365 324/318 |
| 8,207,735 B2* | 6/2012 | Clark | ................ | G01R 33/3628 324/322 |
| 9,429,634 B2* | 8/2016 | Crozier | .............. | G01R 33/3415 |
| 2005/0275403 A1 | 12/2005 | Pinkerton | | |
| 2011/0163751 A1 | 7/2011 | Pinkerton | | |
| 2013/0271144 A1* | 10/2013 | Avdievich | ............ | G01R 33/365 324/322 |
| 2016/0033594 A1 | 2/2016 | Yang | | |
| 2017/0343697 A1 | 11/2017 | Ramirez | | |
| 2018/0275226 A1* | 9/2018 | Yang | .................. | G01R 33/3628 |

FOREIGN PATENT DOCUMENTS

| | | |
|---|---|---|
| CN | 1420363 A | 5/2003 |
| CN | 1941500 A | 4/2007 |
| CN | 105240000 A | 1/2016 |
| CN | 108258927 A | 7/2018 |
| CN | 108828480 A | 11/2018 |
| CN | 201910817886.1 | 3/2020 |
| WO | PCT/CN2019/110305 | 3/2021 |

* cited by examiner

NUCLEAR MAGNETIC RESONANCE COIL ARRAY AND DECOUPLING METHOD THEREOF, AND NUCLEAR MAGNETIC RESONANCE DETECTION DEVICE

CROSS-REFERENCE TO RELATED APPLICATION

This application is a continuation of International Application No. PCT/CN2019/110305, filed on Oct. 10, 2019, which claims priority to Chinese Patent Application No. 201910817886.1, filed on Aug. 30, 2019. Both of the above applications are hereby incorporated by reference in their entireties.

TECHNICAL FIELD

Embodiments of the present application relate to nuclear magnetic resonance logging technology and, in particular, to a nuclear magnetic resonance coil array and a decoupling method thereof, and a nuclear magnetic resonance detection device.

BACKGROUND

Nuclear magnetic resonance is a physical process, in which atomic nucleus with non-zero magnetic moments undergoes Zeeman splitting of spin energy levels under an action of an external magnetic field and a radio frequency field at a certain frequency. Nuclear magnetic resonance logging technology utilizes nuclear magnetic resonance detection devices to detect the formations around a wellbore. The probe is one of the most important components in the nuclear magnetic resonance detection device. Normally, only single radio-frequency antenna is configured in the probe to measure omnidirectional sensitive region or one directional sensitive region with aperture of 60° and 120°. However, the probe does not possess an ability of azimuthal resolution for detecting the downhole formation. During Nuclear magnetic resonance (NMR) well logging interpretation and application, the formation is normally considered to be homogeneous, so that the measured NMR signal is an averaged signal from omnidirectional objectives or azimuthal ones. Therefore, the petrophysical properties can be reflected by the averaged signals.

However, in practical applications of nuclear magnetic resonance detection devices, a measured downhole environment is very complex and harsh, such as complex heterogeneous formation, partial mud intrusion formation, or wellbore collapsed formation, may be happened. In this case, the averaged signal cannot reflect the features of the formation accurately, resulting in poor detection accuracy of the nuclear magnetic resonance detection device.

Coil array detection technology can perform imaging of the formation around the wellbore to obtain rich formation information. However, there exits inductive coupling effect between the arrayed coils of the nuclear magnetic resonance detection device, so that the coil unit cannot transmit and receive signals normally. Therefore, a problem of inductive coupling in nuclear magnetic resonance array coils remains to be solved urgently.

SUMMARY

Embodiments of the present application provide a nuclear magnetic resonance coil array and a decoupling method thereof, and a nuclear magnetic resonance detection device to solve the inductive coupling problem in a downhole nuclear magnetic resonance coil.

In a first aspect, an embodiment of the present application provides a nuclear magnetic resonance coil array, including a coil resonant unit and a decoupling network unit;
  the coil resonant unit includes multiple coil resonant circuits, and the decoupling network unit includes multiple decoupling circuits, where each coil resonant circuit includes a coil and a resonant capacitor;
  the resonant capacitor in each coil resonant circuit is connected in parallel with the coil, the coils in each coil resonant circuit are equally spaced on a circumference, and a decoupling circuit is provided between a positive terminal and a negative terminal of adjacent coils, respectively; and
  each coil is connected to an antenna switching circuit of a nuclear magnetic resonance detection device at the same time and is configured to transmit nuclear magnetic resonance signals sequentially under control of the antenna switching circuit, where each resonant capacitor is configured to tune a transmission frequency of a corresponding nuclear magnetic resonance signal, and the decoupling circuit is configured to eliminate mutual inductance coupling between adjacent coils.

In a possible design, each coil resonant circuit further includes a resistor; and
  the resistor is connected in series with the coil, and is further connected in parallel with the resonant capacitor, a decoupling circuit connector is provided between the resistor and the resonant capacitor, a decoupling circuit connector is provided between the coil and the resonant capacitor, and the decoupling circuit connector is configured to connect with the decoupling circuit.

In a possible design, a decoupling circuit is provided between the positive terminal and the negative terminal of a coil respectively in each coil resonant circuit to eliminate the mutual inductance coupling between the coils.

In a possible design, the coils in each coil resonant circuit are saddle-shaped or eight-figured double-turn coils;
  or, the coils in each coil resonant circuit are saddle-shaped or eight-figured multi-turn coils.

In a possible design, positions of two adjacent coils in each coil resonant circuit are orthogonal.

In a possible design, the resonant capacitor in each coil resonant circuit is respectively located in a capacitor compartment in front of a corresponding coil, and a structure of each resonant capacitor is the same.

In a possible design, each decoupling circuit is located respectively in a compartment in front of a corresponding resonant capacitor, and a structure of each decoupling circuit is the same.

In a possible design, the decoupling circuit includes a decoupling capacitor with an adjustable capacitance.

In a second aspect, an embodiment of the present application provides a decoupling method based on the nuclear magnetic resonance coil array as described in the above first aspect and various possible designs of the first aspect, including:
  tuning electrical parameters of each resonant capacitor respectively to a same state when each unit of the nuclear magnetic resonance coil array is in a disconnected state;
  connecting each resonant capacitor with same electrical parameters to a corresponding coil resonant circuit at the same time, and connecting a decoupling circuit between a positive terminal and a negative terminal of adjacent coils respectively in each coil resonant circuit; and adjusting a decoupling capacitance value of each decoupling circuit to eliminate mutual inductance coupling between adjacent coils.

In a third aspect, an embodiment of the present application provides a nuclear magnetic resonance detection device, including: the nuclear magnetic resonance coil array as described above in the first aspect and various possible designs of the first aspect.

The embodiments provide the nuclear magnetic resonance coil array and the decoupling method thereof, and the nuclear magnetic resonance detection device. The coil array includes a coil resonant unit and a decoupling network unit; the coil resonant unit includes multiple coil resonant circuits, and the decoupling network unit includes multiple decoupling circuits, where a coil resonant circuit includes a coil and a resonant capacitor; the resonant capacitor in each coil resonant circuit is connected in parallel with the coil, and the coils in each coil resonant circuit are equally spaced on the circumference; and a decoupling circuit is provided between the positive terminal and the negative terminal of adjacent coils, respectively. Each coil is connected to the antenna switching circuit of the nuclear magnetic resonance detection device at the same time, and is configured to transmit nuclear magnetic resonance signals sequentially under control of the antenna switching circuit, where each resonant capacitor is configured to tune a transmission frequency of a corresponding nuclear magnetic resonance signal, and the decoupling circuit is configured to eliminate the mutual inductance coupling between adjacent coils. The coil array has a simple structure and excellent performance, which can eliminate the coupling effect between the coil resonant circuits effectively, thereby obtaining precise positions of oil and gas and obtaining high-quality wellbore formation data.

BRIEF DESCRIPTION OF THE DRAWINGS

In order to more clearly describe the technical solutions in the embodiments of the present application or the prior art, the following will briefly introduce the drawings that need to be used in the description of the embodiments or the prior art. It is obvious that the drawings in the following description are some embodiments of the present application, and for those of ordinary skill in the art, other drawings can be obtained based on these drawings without creative effort.

DESCRIPTION OF EMBODIMENTS

Figure 1:
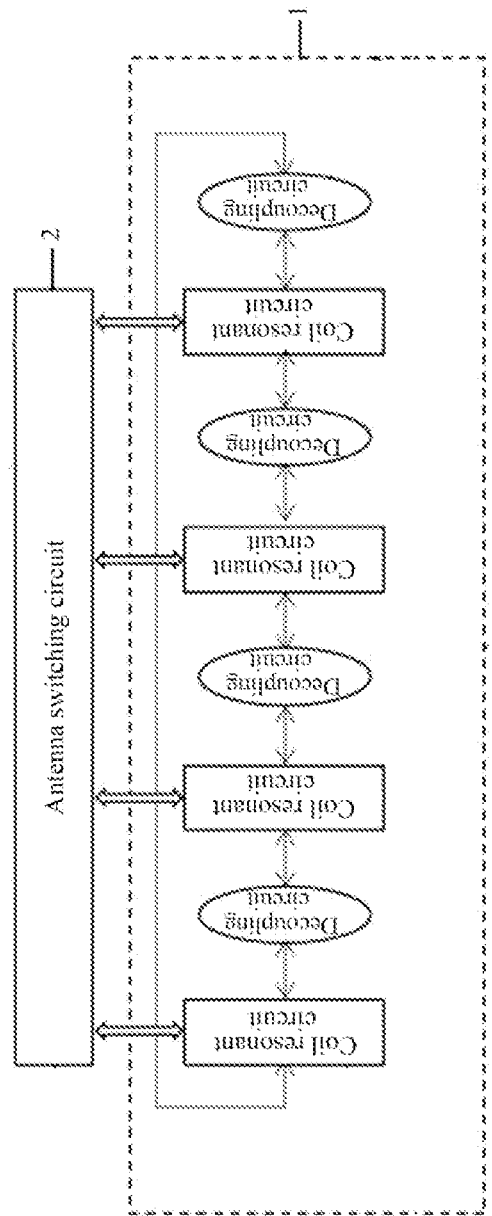
FIG. 1 is a schematic structural diagram of a nuclear magnetic resonance coil array provided by an embodiment of the present application.

In order to make purposes, technical solutions and advantages of the embodiments of the present application clearer, the following will clearly and completely describe the technical solutions in the embodiments of the present application with reference to the drawings in the embodiments of the present application. Obviously, the described embodiments are part of the embodiments of the present application, but not all of the embodiments. Based on the embodiments in the present application, all other embodiments obtained by those of ordinary skill in the art without creative effort shall fall within the protection scope of the present application.

Nuclear magnetic resonance logging technology utilizes nuclear magnetic resonance detection devices to detect the formations around the wellbore. The probe is one of the most important components in the nuclear magnetic resonance detection device, which mostly has a single radio frequency antenna structure and can measure omnidirectional sensitive region of 360° or single azimuthal sensitive region of 60° and 120°. However, the probe does not have a resolving ability on a circumferential direction of a downhole formation. Therefore, current nuclear magnetic resonance detection devices can only measure the formation based on the hypothesis that the formation is homogeneous around borehole. The measured signal is an averaged signal from omnidirectional or a single azimuthal position of the formation, which can be used to reflect the characteristics of the formation.

However, in the practical application of nuclear magnetic resonance detection devices, the measured downhole environment is very harsh and complex, such as complex heterogeneous formation, partial mud intrusion formation, or wellbore collapsed formation, may be happened. In this case, the averaged signal cannot reflect the true characteristics of the formation accurately, resulting in poor detection accuracy of the nuclear magnetic resonance detection device.

Coil array technology can perform imaging of the formation around the wellbore to obtain rich formation information. However, there exits inductive coupling effects between the coils of the nuclear magnetic resonance detection device, so that the coil unit cannot transmit and receive signals normally. Therefore, the problem of inductive coupling in downhole nuclear magnetic resonance array coils remains to be solved urgently.

Therefore, in consideration of the above problems, this embodiment provides a nuclear magnetic resonance coil array, a decoupling method thereof, and a nuclear magnetic resonance detection device. The coil array includes a coil resonant unit and a decoupling network unit; the coil resonant unit includes multiple coil resonant circuits, and the decoupling network unit includes multiple decoupling circuits, where a coil resonant circuit includes a coil and a resonant capacitor; the resonant capacitor in each coil resonant circuit is connected in parallel with the coil, and the coils in each coil resonant circuit are equally spaced on the circumference; a decoupling circuit is provided between the positive terminal and the negative terminal of adjacent coils respectively; and each coil is connected to the antenna switching circuit of the nuclear magnetic resonance detection device, device at the same time and is configured to transmit nuclear magnetic resonance signals sequentially under the control of the antenna switching circuit, where each resonant capacitor is configured to tune a transmission frequency of a corresponding nuclear magnetic resonance signal, and the decoupling circuit is configured to eliminate the mutual inductance coupling between adjacent coils. The coil array has a simple structure and excellent performance, which can eliminate the coupling effect between the coil resonant circuits effectively, thereby obtaining precise positions of oil and gas and obtaining high-quality wellbore formation data.

The technical solution of the present application and how the technical solution of the present application solves the above technical problems will be described in detail below with specific embodiments. The following specific embodiments can be combined with each other, and the same or similar concepts or processes may not be repeated in some embodiments. The embodiments of the present application will be described below in conjunction with the accompanying drawings.

Figure 2:
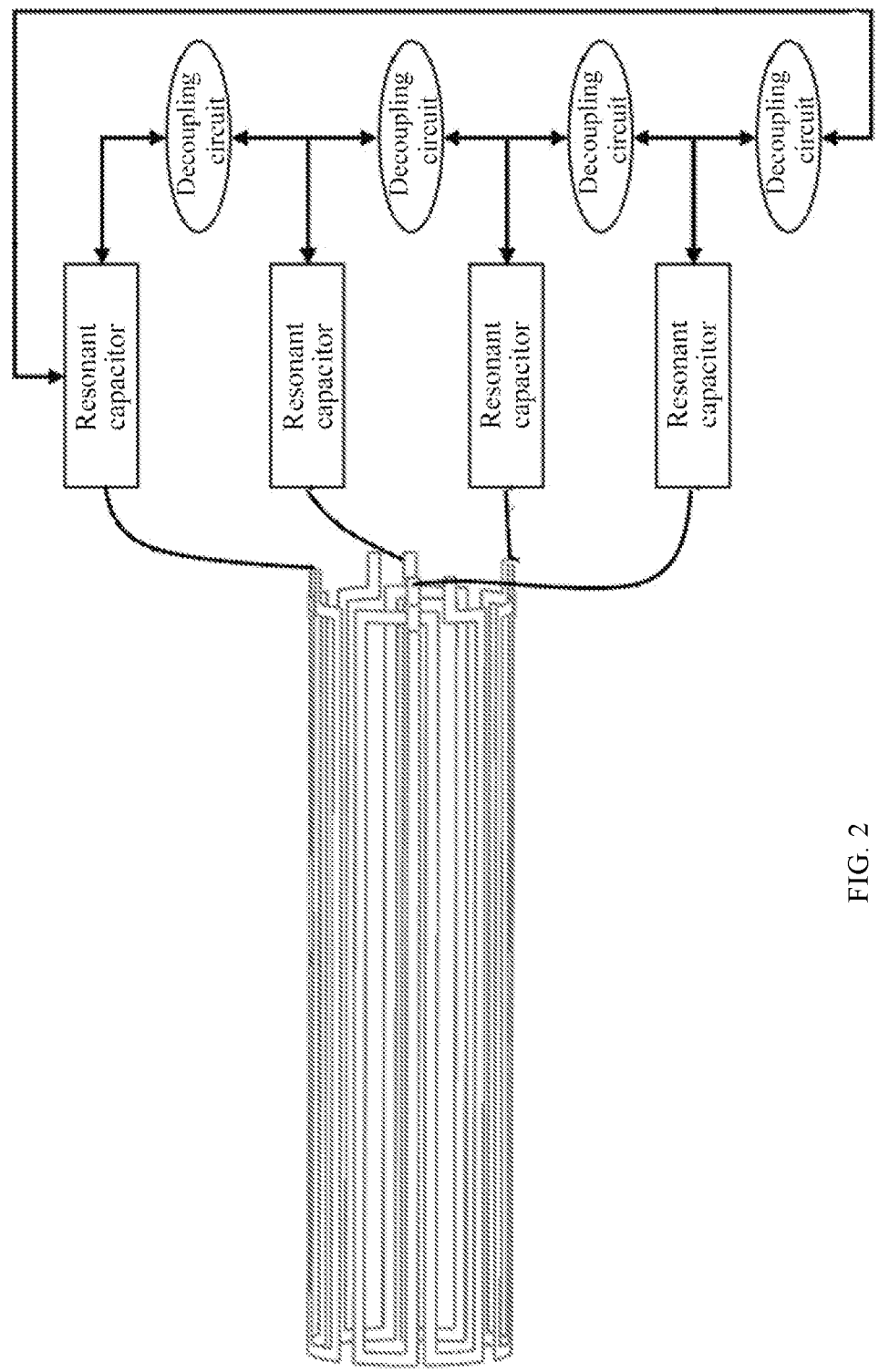
FIG. 2 is a schematic diagram of a three-dimensional structure of the nuclear magnetic resonance coil array provided by an embodiment of the present application.

FIG. 1 is a schematic structural diagram of a nuclear magnetic resonance coil array provided by an embodiment of the present application, and FIG. 2 is a schematic diagram of a three-dimensional structure of the nuclear magnetic resonance coil array provided by an embodiment of the present application. A output port of the coil array 1 is directly connected to an antenna switching circuit 2. As shown in FIG. 1, the coil array 1 may include: a coil resonant unit and a decoupling network unit. FIG. 1 and FIG. 2 take the coil resonant unit including four coil resonant circuits as an example for description, but this embodiment does not specifically limit the number of coil resonant circuits, and the number of the coil resonant circuits can be selected according to specific application scenarios.

The coil resonant unit includes multiple coil resonant circuits, and the decoupling network unit includes multiple decoupling circuits.

Where each coil resonant circuit includes a coil and a resonant capacitor.

The resonant capacitor in each coil resonant circuit is connected in parallel with the coil.

As shown in FIG. 2, the coils in each resonant circuit are equally located on the circumference.

Each coil is connected with the antenna switching circuit 2 of the nuclear magnetic resonance detection device at the same time, and is configured to transmit nuclear magnetic resonance signals sequentially under the control of the antenna switching circuit 2.

Exemplarily, each coil corresponds to a different detection orientation respectively, and each coil can excite regions of interest in different orientations. Taking FIG. 2 as an example, each coil can excite a thin shell-like region of interest with an arc of 90°. The total region of interest is a thin hollow cylinder. Therefore, pulse energy transmission and nuclear magnetic resonance signal reception may be carried on from different azimuths, and the azimuthal signals will not overlap, therefore, the ability to distinguish azimuthal formation information can be improved.

Optionally, the coil in each resonant circuit is a saddle-shaped or eight-figured double-turn coil;

alternatively, the coils in each resonant circuit are saddle-shaped or eight-figured multi-turn coils.

Optionally, positions of two adjacent coils in each coil resonant circuit are orthogonal.

Each resonant capacitor is configured to tune the transmission frequency of the corresponding nuclear magnetic resonance signal.

Optionally, the resonant capacitors in each coil resonant circuit are located in a capacitor compartment in front of a corresponding coil respectively, and the structure of each resonant capacitor is the same, so that each coil can be adjusted to a state having the same transmission impedance, transmission frequency band, and performance.

A decoupling circuit is respectively provided between the positive terminal and the negative terminal of the adjacent coils, and the decoupling circuit is configured to eliminate the mutual inductance coupling between the adjacent coils.

Optionally, each decoupling circuit is located in a compartment in front of the corresponding resonant capacitor respectively, and the structure of each decoupling circuit is the same.

Optionally, when the coupling effect between the spaced coils is large, a decoupling circuit can be provided between the positive terminal and the negative terminal of the spaced coil resonant circuits respectively, to eliminate the mutual inductance coupling between the spaced coils.

Optionally, the decoupling circuit includes a decoupling capacitor with an adjustable capacitance. Exemplarily, by adjusting the capacitance value of the decoupling capacitor, the electrical parameters of the coil resonant circuit affected by the inductive coupling are consistent.

Optionally, in order to eliminate the mutual inductance coupling between the coils of each coil resonant circuit more effectively, the capacitance value of the decoupling capacitor can also be adjusted according to the mutual inductance coupling strength between the coils. For example: the capacitance value of the decoupling capacitor is increased when the mutual inductance coupling between the coils increases.

Optionally, each coil resonant circuit also includes a resistor;

the resistor is connected in series with the coil, and is further connected in parallel with the resonant capacitor, a decoupling circuit connector is provided between the resistor and the resonant capacitor, a decoupling circuit connector is provided between the coil and the resonant capacitor, and the decoupling circuit connector is configured to connect with the decoupling circuit.

Figure 3:
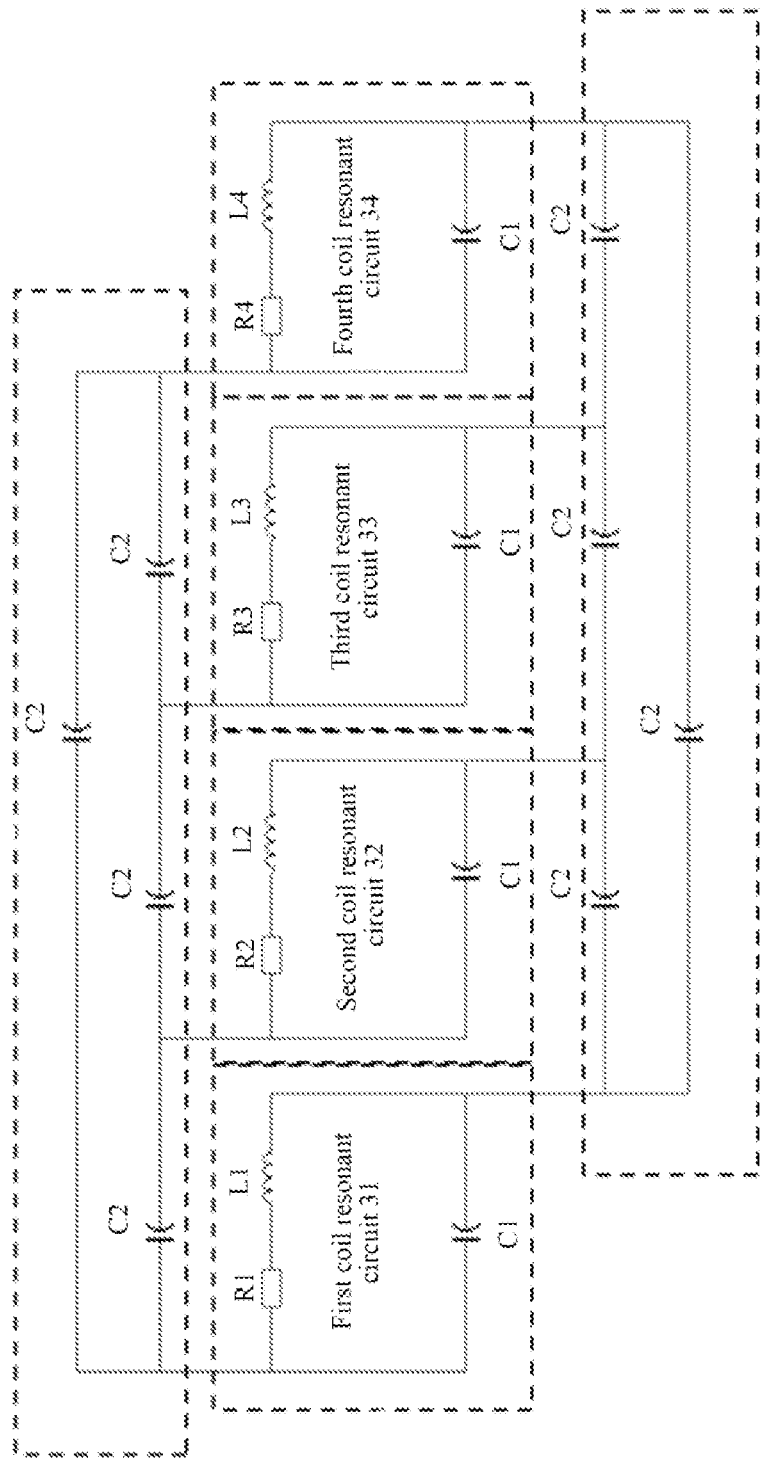
FIG. 3 is a circuit diagram of a nuclear magnetic resonance coil array provided by an embodiment of the present application.

FIG. 3 is a circuit diagram of a nuclear magnetic resonance coil array provided by an embodiment of the present application. FIG. 3 takes the coil resonant unit including four coil resonant circuits and the decoupling circuit including decoupling capacitors as an example for description, but this embodiment does not specifically limit the number of the coil resonant circuit and decoupling circuits. As shown in FIG. 3, the coil resonant unit includes: a first coil resonant circuit 31, a second coil resonant circuit 32, a third coil resonant circuit 33, and a fourth coil resonant circuit 34. The first coil resonant circuit 31 includes a resistor R1, a coil L1, and a resonant capacitor C1. The second coil resonant circuit 32 includes a resistor R2, a coil L2, and a resonant capacitor C1. The third coil resonant circuit 33 includes a resistor R3, a coil L3, and a resonant capacitor C1. The fourth coil resonant circuit 34 includes a resistor R4, a coil L4, and a resonant capacitor C1. A decoupling circuit is provided between the positive terminal and the negative terminal of adjacent coils respectively, namely a decoupling capacitor C2 is provided between the positive terminal and the negative terminal of coil L1 and coil L2, between the positive terminal and the negative terminal of the coil L2 and the coil L3, between the positive terminal and the negative terminal of the coil L3 and the coil L4, and between the positive terminal and the negative terminal of the coil L4 and the coil L1, respectively. Specifically, the positive terminal and the negative terminal between the coil L1 and the coil L2 are provided with a decoupling circuit connector respectively, the positive terminal and the negative terminal of the coil L2 and the coil L3 are provided with a decoupling circuit connector respectively, the positive terminal and the negative terminal of the coil L3 and the coil L4 are provided with a decoupling circuit connector respectively, and the positive terminal and the negative terminal of the coil L4 and the coil L1 are provided with a decoupling circuit connector respectively, through which it is connected to the decoupling capacitor C2.

A decoupling circuit connector is provided between the resistor R1 and the resonant capacitor C1 in the first coil resonant circuit 31, which is connected to a decoupling capacitor C2. A decoupling circuit connector is provided between the resistor R2 and the resonant capacitor C1 in the second coil resonant circuit 32, which is connected to the aforementioned decoupling capacitor C2. A decoupling circuit connector is provided between the coil L1 and the resonant capacitor C1 in the first coil resonant circuit 31, which is connected to another decoupling capacitor C2. A decoupling circuit connector is provided between the coil L2 and the resonant capacitor C1 in the second coil resonant circuit 32, which is connected to the aforementioned another decoupling capacitor C2. A connection relationship between the second coil resonant circuit 32, the third coil resonant circuit 33 and the second group of decoupling circuits; a connection relationship between the third coil resonant circuit 33, the fourth coil resonant circuit 34 and the third group of decoupling circuits; and a connection relationship between the fourth coil resonant circuit 34, the first coil resonant circuit 31, and the fourth group of decoupling circuits are basically the same as the connection relationship between the first coil resonant circuit 31, the second coil resonant circuit 32, and the first group of decoupling circuits, which will not repeated herein.

The nuclear magnetic resonance coil array provided by this embodiment includes a coil resonant unit and a decoupling network unit. The coil resonant unit includes multiple coil resonant circuits, and the decoupling network unit includes multiple decoupling circuits, where a coil resonant circuit includes a coil and a resonant capacitor; the resonant capacitor in each coil resonant circuit is connected in parallel with the coil, and the coils in each coil resonant circuit are equally spaced on the circumference; and a decoupling circuit is provided between the positive terminal and the negative terminal of adjacent coils, respectively. Each coil is connected to the antenna switching circuit of the nuclear magnetic resonance detection device at the same time, and is configured to transmit nuclear magnetic resonance signals sequentially under control of the antenna switching circuit, where each resonant capacitor is configured to tune a transmission frequency of a corresponding nuclear magnetic resonance signal, and the decoupling circuit is configured to eliminate the mutual inductance coupling between adjacent coils. The coil array has a simple structure and excellent performance, which can eliminate the coupling effect between the coil resonant circuits effectively, thereby obtaining precise positions of oil and gas and obtaining high-quality wellbore formation data.

Figure 4:
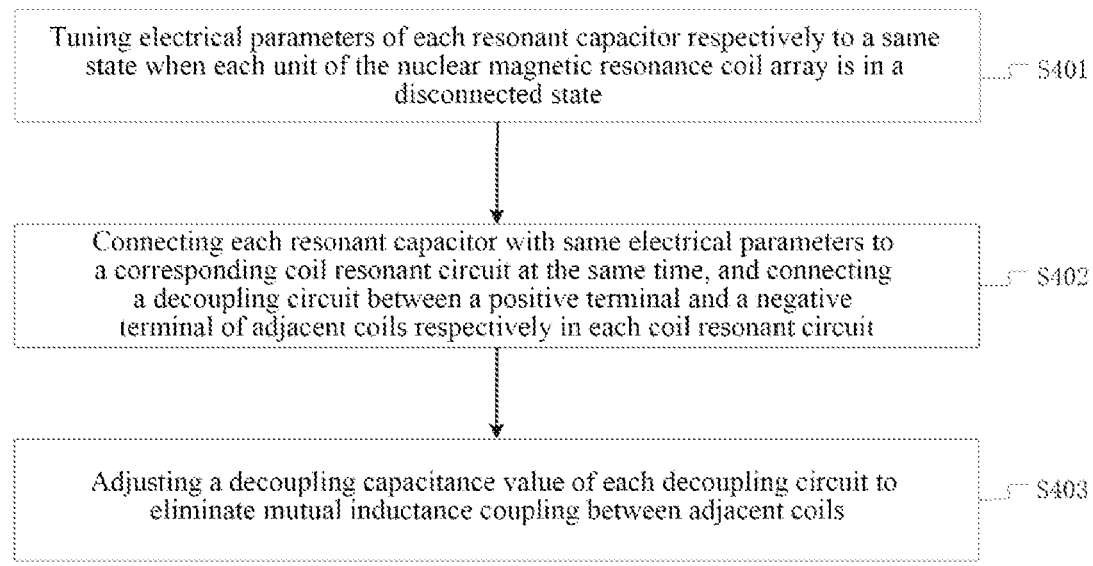
FIG. 4 is a schematic flowchart of a decoupling method for a nuclear magnetic resonance coil array provided by an embodiment of the present application.

FIG. 4 is a schematic flowchart of a decoupling method for a nuclear magnetic resonance coil array provided by an embodiment of the present application. As shown in FIG. 4, this embodiment is a decoupling method based on the nuclear magnetic resonance coil array in the aforementioned embodiment, and includes:

S401: tuning electrical parameters of each resonant capacitor respectively to a same state when each unit of the nuclear magnetic resonance coil array is in a disconnected state.

Exemplarily, when the other units are in a disconnected state, the coil resonant capacitance of each coil resonant unit is tuned respectively to the state of the same impedance, the same frequency, and the same electrical parameters such as the same Q value, so that the coil of each coil resonant circuit has the same transmitting impedance, transmitting frequency band and performance during transmission.

S402: connecting each resonant capacitor with same electrical parameters to a corresponding coil resonant circuit at the same time, and connecting a decoupling circuit between a positive terminal and a negative terminal of adjacent coils respectively in each coil resonant circuit.

Exemplarily, all resonant capacitors with the same electrical parameters are connected to the corresponding coil resonant circuit at the same time, and a decoupling circuit is connected between the positive terminal and the negative terminal of adjacent coil units respectively in each coil resonant circuit, and the impedance, the frequency, the Q value and other typical parameters between each coil resonant circuits are checked and recorded, respectively.

S403: adjusting a decoupling capacitance value of each decoupling circuit to eliminate mutual inductance coupling between adjacent coils.

Exemplarily, the decoupling capacitor value of the decoupling circuit is adjusted until the frequency and the Q value between the coils of each coil resonant circuit are the same and the impedance reaches a maximum value, and the coupling effect is completely eliminated.

The decoupling method of the nuclear magnetic resonance coil array provided by this embodiment is to tune the electrical parameters of each resonant capacitor respectively to a same state when each unit of the nuclear magnetic resonance coil array is in a disconnected state, then connect each resonant capacitor with the same electrical parameter to the corresponding coil resonant circuit at the same time, connect a decoupling circuit between the positive terminal and the negative terminal of adjacent coils respectively in each coil resonant circuit, and adjust the decoupling capacitance value of each decoupling circuit to eliminate the mutual inductance coupling between adjacent coils. The aforementioned decoupling method can eliminate the coupling effect between the coil resonant circuits effectively and enhance the performance of the coil array, thereby obtaining precise positions of oil and gas and obtaining high-quality wellbore formation data.

Figure 5:
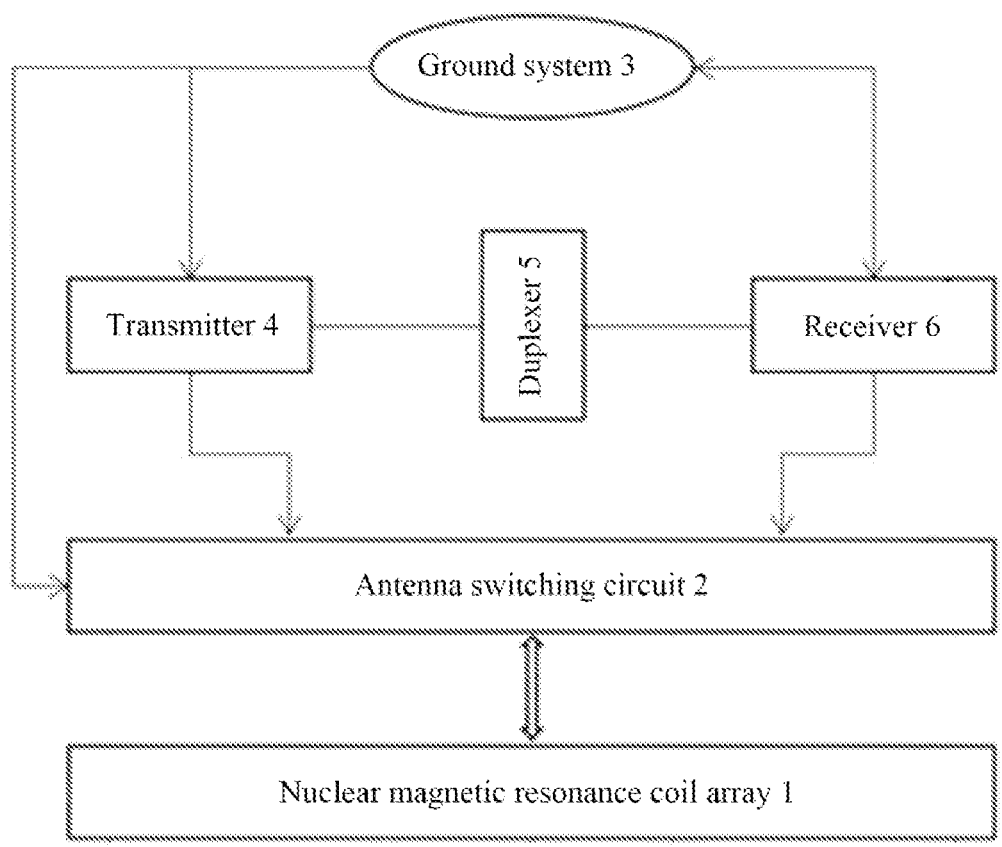
FIG. 5 is a schematic structural diagram of a nuclear magnetic resonance detection device provided by an embodiment of the present application.

FIG. 5 is a schematic structural diagram of a nuclear magnetic resonance detection device provided by an embodiment of the present application. As shown in FIG. 5, the device includes: the nuclear magnetic resonance coil array 1 of the aforementioned embodiment.

The nuclear magnetic resonance coil array 1 is configured to receive a switching command, and switch the coil resonant circuit according to the switching command.

Optionally, the device further includes: an antenna switching circuit 2, a ground system 3, a transmitter 4, a duplexer 5, and a receiver 6.

The aforementioned antenna switching circuit 2 is configured to send the switching command to the nuclear magnetic resonance coil array 1.

The aforementioned ground system 3 is configured to send detection instructions and process data.

The aforementioned transmitter 4 is configured to transmit a high-power signal.

The aforementioned duplexer 5 is configured to isolate the noise during pulse signal transmission and weak signal reception.

The aforementioned receiver 6 is configured to receive a weak signal.

The nuclear magnetic resonance detection device provided in this embodiment can obtain precise positions of oil and gas and obtaining high-quality wellbore formation data.

Finally, it should be noted that the above embodiments are only used to illustrate the technical solutions of the present application, rather than limiting them. Although the present application has been described in detail with reference to the foregoing embodiments, those of ordinary skill in the art should understand that: it is still possible to modify the technical solutions described in the foregoing embodiments, or equivalently replace some or all of the technical features; and these modifications or replacements do not make the essence of the corresponding technical solutions depart from scope of the technical solutions of the embodiments of the present application.

What is claimed is:

1. A nuclear magnetic resonance coil array, comprising a coil resonant unit and a decoupling network unit;
the coil resonant unit comprises multiple coil resonant circuits, and the decoupling network unit comprises multiple decoupling circuits, wherein each coil resonant circuit comprises a coil and a resonant capacitor;
the resonant capacitor in each coil resonant circuit is connected in parallel with the coil, wherein the coils in each coil resonant circuit are equally spaced on a circumference, and a decoupling circuit is provided between a positive terminal of an inductor of the coil and a negative terminal of another inductor of an adjacent coils; and
each coil is connected to an antenna switching circuit of a nuclear magnetic resonance detection device at the same time and is configured to transmit nuclear magnetic resonance signals sequentially under control of the antenna switching circuit, wherein each resonant capacitor is configured to tune a transmission frequency of a corresponding nuclear magnetic resonance signal, and the decoupling circuit is configured to eliminate mutual inductance coupling between adjacent coils;
wherein each coil resonant circuit further comprises a resistor, and
the resistor is connected in series with the coil, and is further connected in parallel with the resonant capacitor, a decoupling circuit connector is provided between the resistor and the resonant capacitor, another decoupling circuit connector is provided between the coil and the resonant capacitor, wherein the decoupling circuit connector and the another decoupling circuit connector are configured to connect with the decoupling circuit.

2. The coil array according to claim 1, wherein the decoupling circuit is provided between the positive terminal of the inductor of the coil and the negative terminal of the another inductor of the adjacent coil respectively in each coil resonant circuit to eliminate the mutual inductance coupling between the coils.

3. The coil array according to claim 1, wherein the coils in each coil resonant circuit are saddle-shaped or eight-figured double-turn coils;
or, the coils in each coil resonant circuit are saddle-shaped or eight-figured multi-turn coils.

4. The coil array according to claim 1, wherein positions of two adjacent coils in each coil resonant circuit are orthogonal.

5. The coil array according to claim 1, wherein the resonant capacitor in each coil resonant circuit is respectively located in a capacitor compartment in front of a corresponding coil, and a structure of each resonant capacitor is the same.

6. The coil array according to claim 1, wherein each decoupling circuit is located respectively in a compartment in front of a corresponding resonant capacitor, and a structure of each decoupling circuit is the same.

7. The coil array according to claim 1, wherein the decoupling circuit comprises a decoupling capacitor with an adjustable capacitance.

8. A decoupling method using the nuclear magnetic resonance coil array according to claim 1, said method comprising:
tuning electrical parameters of each resonant capacitor respectively to a same state when each unit of the nuclear magnetic resonance coil array is in a disconnected state;
connecting each resonant capacitor with same electrical parameters to a corresponding coil resonant circuit at the same time, and connecting a decoupling circuit between a positive terminal and a negative terminal of adjacent coils respectively in each coil resonant circuit; and
adjusting a decoupling capacitance value of each decoupling circuit to eliminate mutual inductance coupling between adjacent coils.

9. A decoupling method using the nuclear magnetic resonance coil array according to claim 2, said method comprising:
tuning electrical parameters of each resonant capacitor respectively to a same state when each unit of the nuclear magnetic resonance coil array is in a disconnected state;
connecting each resonant capacitor with same electrical parameters to a corresponding coil resonant circuit at the same time, and connecting a decoupling circuit between a positive terminal and a negative terminal of adjacent coils respectively in each coil resonant circuit; and
adjusting a decoupling capacitance value of each decoupling circuit to eliminate mutual inductance coupling between adjacent coils.

10. The coil array according to claim 1, wherein each coil corresponds to a different detection orientation respectively, and each coil excites a region of interest in a different orientation, wherein each coil excites a thin shell-like region of interest with an arc of 90°, and a total region of interest is a thin hollow cylinder.

11. The decoupling method according to claim 8, wherein each coil corresponds to a different detection orientation respectively, and each coil excites a region of interest in a different orientation, wherein each coil excites a thin shell-like region of interest with an arc of 90°, and a total region of interest is a thin hollow cylinder.

12. A nuclear magnetic resonance detection device, comprising: a nuclear magnetic resonance coil array, wherein the nuclear magnetic resonance coil array comprises a coil resonant unit and a decoupling network unit;
the coil resonant unit comprises multiple coil resonant circuits, and the decoupling network unit comprises multiple decoupling circuits, wherein each coil resonant circuit comprises a coil and a resonant capacitor;
the resonant capacitor in each coil resonant circuit is connected in parallel with the coil, wherein the coils in each coil resonant circuit are equally spaced on a circumference, and a decoupling circuit is provided between a positive terminal of an inductor of the coil and a negative terminal of another inductor of an adjacent coil; and
each coil is connected to an antenna switching circuit of the nuclear magnetic resonance detection device at the same time and is configured to transmit nuclear magnetic resonance signals sequentially under control of the antenna switching circuit, wherein each resonant capacitor is configured to tune a transmission frequency of a corresponding nuclear magnetic resonance signal, and the decoupling circuit is configured to eliminate mutual inductance coupling between adjacent coils;

wherein each coil resonant circuit further comprises a resistor, and the resistor is connected in series with the coil, and is further connected in parallel with the resonant capacitor, a decoupling circuit connector is provided between the resistor and the resonant capacitor, another decoupling circuit connector is provided between the coil and the resonant capacitor, wherein the decoupling circuit connector and the another decoupling circuit connector are configured to connect with the decoupling circuit.

13. The nuclear magnetic resonance detection device according to claim 12, wherein the decoupling circuit is provided between the positive terminal of the inductor of the coil and the negative terminal of the another inductor of the adjacent coil respectively in each coil resonant circuit to eliminate the mutual inductance coupling between the coils.

14. The nuclear magnetic resonance detection device according to claim 12, wherein the coils in each coil resonant circuit are saddle-shaped or eight-figured double-turn coils;

or, the coils in each coil resonant circuit are saddle-shaped or eight-figured multi-turn coils.

15. The nuclear magnetic resonance detection device according to claim 12, wherein positions of two adjacent coils in each coil resonant circuit are orthogonal.

16. The nuclear magnetic resonance detection device according to claim 12, wherein the resonant capacitor in each coil resonant circuit is respectively located in a capacitor compartment in front of a corresponding coil, and a structure of each resonant capacitor is the same.

17. The nuclear magnetic resonance detection device according to claim 12, wherein each coil corresponds to a different detection orientation respectively, and each coil excites a region of interest in a different orientation, wherein each coil excites a thin shell-like region of interest with an arc of 90°, and a total region of interest is a thin hollow cylinder.

* * * * *